(12) United States Patent
Ye

(10) Patent No.: US 11,844,261 B2
(45) Date of Patent: Dec. 12, 2023

(54) OLED DISPLAY PANEL AND ELECTRONIC DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 530 days.

(21) Appl. No.: 17/254,270

(22) PCT Filed: Aug. 6, 2020

(86) PCT No.: PCT/CN2020/107280
§ 371 (c)(1),
(2) Date: Dec. 19, 2020

(87) PCT Pub. No.: WO2022/016621
PCT Pub. Date: Jan. 27, 2022

(65) Prior Publication Data
US 2022/0293687 A1   Sep. 15, 2022

(30) Foreign Application Priority Data
Jul. 21, 2020 (CN) .......................... 202010704184.5

(51) Int. Cl.
*H01L 27/14* (2006.01)
*H10K 59/40* (2023.01)
(Continued)

(52) U.S. Cl.
CPC ............. *H10K 59/40* (2023.02); *G06F 3/044* (2013.01); *G06F 3/0412* (2013.01); *H10K 59/122* (2023.02); *H10K 59/124* (2023.02)

(58) Field of Classification Search
CPC .... H10K 59/40; H10K 59/122; H10K 59/124; H10K 59/00; G06F 3/0412; G06F 3/044;
(Continued)

(56) References Cited

U.S. PATENT DOCUMENTS 10,635,209 B2 * 4/2020 Seong .................. G06F 3/0446
2016/0282987 A1 9/2016 Choi et al.

FOREIGN PATENT DOCUMENTS

CN      103389824 A    11/2013
CN      106406590 A     2/2017
(Continued)

OTHER PUBLICATIONS

Notification to Grant Patent Right for Invention issued in corresponding Chinese Patent Application No. 202010704184.5 dated Jan. 26, 2022, pp. 1-5.
(Continued)

*Primary Examiner* — Tan N Tran
(74) *Attorney, Agent, or Firm* — PV IP PC; Wei Te Chung; Zhigang Ma (57) ABSTRACT

The present application provides an organic light-emitting diode (OLED) display panel and an electronic device. A projection of a touch electrode of the OLED display panel projected on a base substrate is at least partially overlapped with a projection of a support pillar projected on the base substrate. The support pillar includes at least one side surface. An angle between an upper top surface of the support pillar is less than or equal to 90 degrees, and/or an angle between the side surface and a lower bottom surface of the support pillar is greater than or equal to 90 degrees.
(Continued)

A common electrode layer is disconnected at the support pillar. Accordingly, the present application improves a report rate for touch control and enhances touch sensitivity of the OLED display panel.

20 Claims, 7 Drawing Sheets

(51) Int. Cl.
*G06F 3/041* (2006.01)
*G06F 3/044* (2006.01)
*H10K 59/122* (2023.01)
*H10K 59/124* (2023.01)

(58) Field of Classification Search
CPC . G06F 2203/04102; G06F 2203/04107; G06F 2203/04112; G06F 3/0446; G06F 3/0418; H01L 27/323; H01L 27/3225; H01L 27/3258
USPC .............................................. 257/59, 72, 40
See application file for complete search history.

(56) References Cited

FOREIGN PATENT DOCUMENTS

| | | |
|---|---|---|
| CN | 107037921 A | 8/2017 |
| CN | 107123621 A | 9/2017 |
| CN | 206657340 U | 11/2017 |
| CN | 107706212 A | 2/2018 |
| CN | 108803928 A | 11/2018 |
| CN | 109213348 A | 1/2019 |
| CN | 109360837 A | 2/2019 |
| CN | 110286803 A | 9/2019 |
| CN | 110321027 A | 10/2019 |
| CN | 110321028 A | 10/2019 |
| CN | 110752244 A | 2/2020 |

OTHER PUBLICATIONS

International Search Report in International application No. PCT/CN2020/107280, dated Apr. 20, 2021.
Written Opinion of the International Search Authority in International application No. PCT/CN2020/107280, dated Apr. 20, 2021.
Chinese Office Action issued in corresponding Chinese Patent Application No. 202010704184.5 dated May 7, 2021, pp. 1-7.

\* cited by examiner

OLED DISPLAY PANEL AND ELECTRONIC DEVICE

RELATED APPLICATIONS

This application is a Notional Phase of PCT Patent Application No. PCT/CN2020/107280 having international filing date of Aug. 6, 2020, which claims the benefit of priority of Chinese Patent Application No. 202010704184.5 filed on Jul. 21, 2020. The contents of the above applications are all incorporated by reference as if fully set forth herein in their entirety.

FIELD OF DISCLOSURE

The present application relates to a field of display technology and in particular, to an organic light-emitting diode (OLED) display panel and an electronic device.

DESCRIPTION OF RELATED ART

Due to durability, a long lifespan, and support for multi-touch functions, capacitive touch screens are widely used in various electronic devices which can create interactive scenes. A working principle of the capacitive touch screen is to detect a specific position of a finger touch by detecting a change of a capacitance at the position of the finger touch.

Currently for flexible active-matrix organic light-emitting diode (AMOLED) on-cell (a touch layer integrated on an AMOLED cover) display panels, their touch electrodes are usually made directly on an upper surface of a thin film encapsulation layer. However, because the thin film encapsulation layer is thin (usually having a thickness less than 10 microns), a distance between the touch electrode and a cathode is short, and a parasitic capacitance between the touch electrode and the cathode is relatively high, causing a long resistive-capacitive (RC) delay in a channel of the touch electrode at a far end in a large-sized touch screen, thereby resulting in a low scan frequency of the touch electrode, which in turn compromises the performance of important features such as a report rate for touch control.

In addition, in conventional techniques, it is common to form multiple support pillars on a pixel definition layer in order to prevent a mask from scratching a film structure of an organic light-emitting diode (OLED) display panel during a deposition process of a light-emitting material and to enhance the pressure resistance of the OLED display panel while maintaining the uniformity of a cell thickness of a large-sized OLED display panel. The support pillar has a shape of a round platform (a truncated cone) or prism with a small top and a large bottom. The support pillar with such a structure maintains a continuous structure of a cathode material, so that a distance between a cathode located above the support pillar and a touch electrode is shorter than those at other positions, and a parasitic capacitance between the touch electrode and the cathode above the support pillar is higher than those at other positions, which increases a resistive-capacitive (RC) delay in touch signals and thereby affects the a report rate for touch control and compromises touch sensitivity of a touch screen.

Therefore, there is a need to solve the problem of a low report rate for touch control on the conventional AMOLED on-cell display panels

SUMMARY

The present application provides an organic light-emitting diode (OLED) display panel and an electronic device to improve the problem of low report rate in conventional active-matrix organic light-emitting diode (AMOLED) on-cell display panels.

The present application provides an organic light-emitting diode (OLED) display panel, comprising:
  a base substrate;
  a driving circuit layer arranged on the base substrate;
  a light-emitting function layer arranged on the driving circuit layer, the light-emitting function layer comprising a pixel electrode layer, a pixel definition layer, a support pillar, a light-emitting material layer, and a common electrode layer which are sequentially arranged in a direction away from the base substrate, the common electrode layer covering the pixel definition layer, the support pillar, and the light-emitting material layer;
  an encapsulation layer arranged on the common electrode layer; and
  a touch layer arranged on the encapsulation layer and comprising a touch electrode, wherein the touch electrode is a grid structure surrounding the light-emitting material layer, and a projection of the touch electrode projected on the base substrate at least partially overlaps a projection of the support pillar projected on the base substrate;
  wherein the support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
  wherein the common electrode layer comprises a floating electrode covering the upper top surface and a common electrode covering the pixel definition layer and the light-emitting material layer, and the floating electrode is disconnected from the common electrode.

In the OLED display panel of the present application, a projection of grid lines of the touch electrode projected on the base substrate passes through a projection of the support pillar projected on the base substrate.

In the OLED display panel of the present application, a height of the support pillar with respect to the pixel definition layer ranges from 1.5 microns to 2 microns, and a thickness of the common electrode layer ranges from 15 nanometers to 20 nanometers.

In the OLED display panel of the present application, a geometric shape of the support pillar is a prismatoid.

In the OLED display panel of the present application, the geometric shape of the support pillar is a round platform, a lower bottom surface of the round platform is in contact with the pixel definition layer, and the lower bottom surface of the round platform projected on the base substrate is located within a projection of an upper top surface of the round platform projected on the base substrate.

In the OLED display panel of the present application, the geometric shape of the support pillar is a prism, a lower bottom surface of the prism is in contact with the pixel definition layer, and a projection of the lower bottom surface of the prism projected on the base substrate is located within a projection of the an upper top surface of the prism projected on the base substrate.

In the OLED display panel of the present application, the geometric shape of the support pillar is a ball-like platform, a lower bottom surface of the ball-like platform is in contact with the pixel definition layer, and the lower bottom surface of the ball-like platform projected on the base substrate is located within a projection of an upper top surface of the ball-like platform projected on the base substrate.

In the OLED display panel of the present application, the geometric shape of the support pillar is a tower, a lower bottom surface of the tower is in contact with the pixel definition layer, and a projection of the lower bottom surface of the tower projected on the base substrate is located within a projection of an upper top surface of the tower projected on the base substrate.

In the OLED display panel of the present application, the geometric shape of the support pillar is a cylinder.

In the OLED display panel of the present application, the geometric shape of the support pillar is a prism.

In the OLED display panel of the present application, at least one side surface of the support pillar is a concave curved surface, and an angle between the curved surface and the upper top surface of the support pillar and an angle between the curved surface and the lower bottom surface of the support pillar are both acute.

In the OLED display panel of the present application, a geometric shape of the support pillar is a non-prismatoid.

The present application further provides an electronic device comprising an organic light-emitting diode (OLED) display panel, the OLED display panel comprising:
  a base substrate;
  a driving circuit layer arranged on the base substrate;
  a light-emitting function layer arranged on the driving circuit layer, the light-emitting function layer comprising a pixel electrode layer, a pixel definition layer, a support pillar, a light-emitting material layer, and a common electrode layer which are sequentially arranged in a direction away from the base substrate, the common electrode layer covering the pixel definition layer, the support pillar, and the light-emitting material layer;
  an encapsulation layer arranged on the common electrode layer; and
  a touch layer arranged on the encapsulation layer and comprising a touch electrode, wherein the touch electrode is a grid structure surrounding the light-emitting material layer, and a projection of the touch electrode projected on the base substrate at least partially overlaps a projection of the support pillar projected on the base substrate;
  wherein the support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
  wherein the common electrode layer comprises a floating electrode covering the upper top surface and a common electrode covering the pixel definition layer and the light-emitting material layer, and the floating electrode is disconnected from the common electrode.

In the electronic device of the present application, a projection of grid lines of the touch electrode projected on the base substrate passes through a projection of the support pillar projected on the base substrate.

In the electronic device of the present application, a height of the support pillar with respect to the pixel definition layer ranges from 1.5 microns to 2 microns, and a thickness of the common electrode layer ranges from 15 nanometers to 20 nanometers.

In the electronic device of the present application, a geometric shape of the support pillar is a prismatoid.

In the electronic device of the present application, the geometric shape of the support pillar is any one of a round platform, a prism, a ball-like platform, and a tower, and a projection of the lower bottom surface of the support pillar projected on the substrate is located within a projection of the upper top surface of the support pillar projected on the base substrate.

In the electronic device of the present application, the geometric shape of the support pillar is a cylinder or a prism.

In the electronic device of the present application, at least one side surface of the support pillar is a concave curved surface, and an angle between the curved surface and the upper top surface of the support pillar and an angle between the curved surface and the lower bottom surface of the support pillar are both acute.

In the electronic device of the present application, a geometric shape of the support pillar is a non-prismatoid.

The present application provides an organic light-emitting diode (OLED) display panel and an electronic device. The OLED display panel comprises:
  a base substrate;
  a driving circuit layer arranged on the base substrate;
  a light-emitting function layer arranged on the driving circuit layer, the light-emitting function layer comprising a pixel electrode layer, a pixel definition layer, a support pillar, a light-emitting material layer, and a common electrode layer which are sequentially arranged in a direction away from the base substrate, the common electrode layer covering the pixel definition layer, the support pillar, and the light-emitting material layer;
  an encapsulation layer arranged on the common electrode layer; and
  a touch layer arranged on the encapsulation layer and comprising a touch electrode, wherein the touch electrode is a grid structure surrounding the light-emitting material layer, and a projection of the touch electrode projected on the base substrate at least partially overlaps a projection of the support pillar projected on the base substrate;
  wherein the support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
  wherein the common electrode layer comprises a floating electrode covering the upper top surface and a common electrode covering the pixel definition layer and the light-emitting material layer, and the floating electrode is disconnected from the common electrode. The OLED display panel has an improved structural design for the support pillar, so that there is no smooth transition between the support pillar and the pixel definition layer. After deposition of the material of the common electrode layer, the portion of the common electrode layer covering the upper top surface of the support pillar cannot form a continuous film layer with the portion of the common electrode layer covering the pixel definition layer and the light-emitting material layer. Therefore, the portion of the common electrode layer covering the upper top surface of the support pillar forms a floating electrode, the portion of the common electrode layer covering the pixel definition layer and the light-emitting material layer forms a common electrode, and the floating electrode is disconnected from the common electrode. The floating electrode does not receive electrical signals, thus reducing the parasitic capacitance between the touch electrode and the common electrode, thereby improving the report rate for touch control, and enhancing touch sensitivity of the OLED display panel.

BRIEF DESCRIPTION OF DRAWINGS

A description is provided below with reference to the accompanying drawings and in conjunction with the specific embodiments, so as to ease understanding of the technical solutions and other advantages of the present application.

DETAILED DESCRIPTION OF EMBODIMENTS

The present application provides an OLED display panel to improve a problem of a low report rate for touch control in conventional active-matrix organic light-emitting diode (AMOLED) on-cell (a touch layer integrated on an AMOLED cover) display screens.

Figure 1:
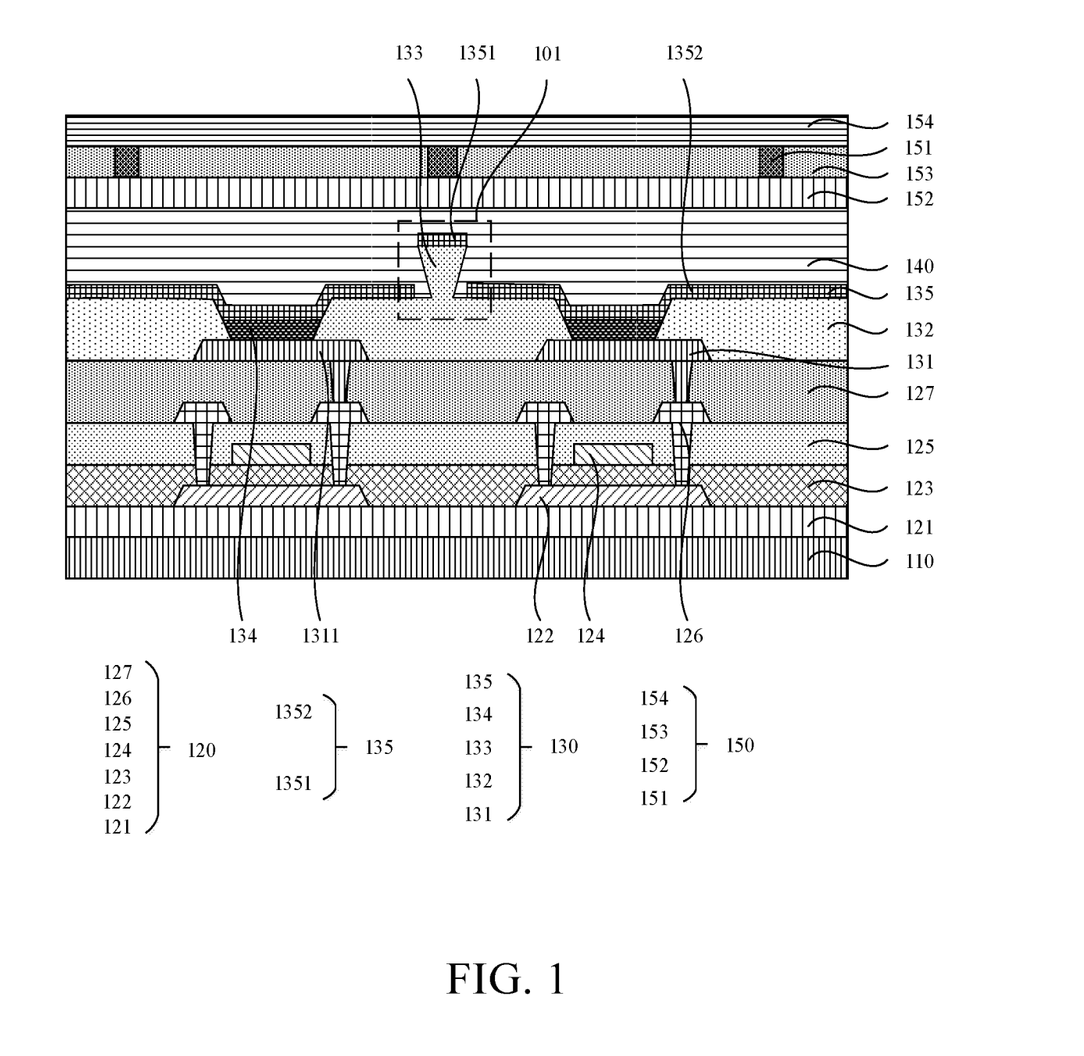
FIG. 1 is a first structural view illustrating an organic light-emitting diode (OLED) display panel according to one embodiment of the application.

Please refer to FIG. 1 which shows a first schematic structural view illustrating an organic light-emitting diode (OLED) display panel according to one embodiment of the present application. As shown in FIG. 1, the OLED display panel of the present application comprises:
a base substrate 110;
a driving circuit layer 120 arranged on the base substrate 110;
a light-emitting function layer 130 arranged on the driving circuit layer 120, the light-emitting function layer 130 comprising a pixel electrode layer 131, a pixel definition layer 132, a support pillar 133, a light-emitting material layer 134, and a common electrode layer 135 which are sequentially arranged in a direction away from the base substrate 110, the common electrode layer 135 covering the pixel definition layer 132, the support pillar 133, and the light-emitting material layer 134;
an encapsulation layer 140 arranged on the common electrode layer 135; and
a touch layer 150 arranged on the encapsulation layer 140 and comprising a touch electrode 151, wherein the touch electrode 151 is a grid structure surrounding the light-emitting material layer 134, and a projection of the touch electrode 133 projected on the base substrate 110 at least partially overlaps a projection of the support pillar 133 projected on the base substrate 110;
wherein the support pillar 133 comprises a lower bottom surface in contact with the pixel definition layer 132, an upper top surface away from the pixel definition layer 132, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
wherein the common electrode layer 135 comprises a floating electrode 1351 covering the upper top surface and a common electrode 1352 covering the pixel definition layer 132 and the light-emitting material layer 134, and the floating electrode 1351 is disconnected from the common electrode 1352.

The present embodiment provides an OLED display panel. The OLED display panel comprises a support pillar. The support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees. The common electrode layer comprises a floating electrode covering the upper top surface and a common electrode covering the pixel definition layer and the light-emitting material layer, and the floating electrode is disconnected from the common electrode. By improving a structural design of the support pillar, there is no smooth transition between the support pillar and the pixel definition layer. After deposition of a material of the common electrode layer, a portion of the common electrode layer covering the upper top surface of the support pillar cannot form a continuous film layer with a portion of the common electrode layer which covers the pixel definition layer and the light-emitting material layer, so that the portion of the common electrode layer covering the upper top surface of the support pillar forms a floating electrode, the portion of the common electrode layer which covers the pixel definition layer and the light-emitting material layer forms the common electrode, and the floating electrode is disconnected from the common electrode. The floating electrode does not receive electrical signals, thereby reducing a parasitic capacitance between the touch electrode and the common electrode, improving a report rate for touch control, and enhancing touch sensitivity of the OLED display panel.

Please refer to FIGS. 1 to 10 for the specific structure of the OLED display panel according to the present application.

The base substrate 110 can be a rigid substrate or a flexible substrate. The rigid substrate is generally a glass substrate composed of aluminosilicate and other components. The flexible substrate generally includes a first organic substrate, an inorganic substrate, and a second inorganic substrate. The first organic substrate and the second organic substrate are used to achieve flexibility of the OLED display panel, and the inorganic substrate is used to maintain the support performance of the flexible substrate and prevent water and oxygen outside the OLED display panel from entering the OLED display panel.

The driving circuit layer 120 is disposed on the base substrate 110. The driving circuit layer 120 comprises thin film transistors arranged in an array and metal lines, and the thin film transistors are connected to the metal lines to form a driving circuit of the OLED display panel to drive the light-emitting function layer 130 for providing light-emitting display functions. The driving circuit layer 120 comprises a first buffer layer 121, a semiconductor active layer 122, a first insulating layer 123, a gate metal layer 124, a second insulating layer 125, a source/drain layer 126, a planarization layer 127 which are sequentially stacked on the base substrate 110. The semiconductor active layer 122 is patterned to form a channel of the thin film transistor. The gate metal layer 124 is patterned to form a gate of the thin film transistor and a scan line of the driving circuit. The source/drain layer 126 is patterned to form a source and a drain of the thin film transistor and to form a data line and a power line, and so on of the driving circuit. The planarization layer 127 covers the second insulating layer 125 and the source/drain layer 126, so as to planarize the driving circuit layer 120 and provide a flat substrate for producing the pixel electrode layer 131. The planarization layer 127 is typically made of an organic material.

In the embodiments shown in the drawings, the thin film transistor is a top-gate thin film transistor. In alternative embodiments, the thin film transistor can also be a bottom-gate thin film transistor. In the embodiment shown in FIG. 1, the thin film transistor is a single-gate thin film transistor. In alternative embodiments, the thin film transistor can also be a double-gate thin film transistor or a triple-gate thin film transistor; and the present application is not limited in this regard.

The light-emitting function layer 130 comprises the pixel electrode layer 131, the pixel definition layer 132, the support pillar 133, the light-emitting material layer 134, and the common electrode layer 135 that are sequentially disposed in a direction away from the base substrate 110. The pixel electrode layer 131 is patterned to form a pixel electrode 1311. The pixel definition layer 132 is patterned to form a pixel definition region 1321. The pixel definition region 1321 is arranged corresponding to the pixel electrode 1311, and is located on the pixel electrode 1311 and exposes the pixel electrode 1311. The light-emitting material layer 134 is formed in the pixel definition region 1321 and is in contact with the pixel electrode 1311.

The support pillar 133 is formed on one side of the pixel definition layer 132 away from the base substrate 110, as shown in FIGS. 1 to 9. The support pillar 133 comprises an upper top surface, a lower bottom surface, and a side surface connected to the upper top surface and the lower bottom surface. The lower bottom surface is in contact with the pixel definition layer 132. The upper top surface is away from the pixel definition layer 132. An angle between the side surface and the upper top surface is less than or equal to 90 degrees, and/or an angle between the side surface and the lower bottom surface is greater than or equal to 90 degrees. The support pillar 133 and the pixel definition layer 132 can be integrally formed, or can be formed separately. A height of the support pillar 133 ranges from 1.5 microns to 2.0 microns, and a diameter of the support pillar 133 ranges from 4 microns to 6 microns.

The common electrode layer 135 covers the pixel definition layer 132, the support pillar 133, and the light-emitting material layer 134. A thickness of the common electrode layer 135 is 15 to 20 nanometers, which is much less than a height of the support pillar 133. In addition, the support pillar 133 comprises a lower bottom surface in contact with the pixel definition layer 132, an upper top surface away from the pixel definition layer 132, and a side surface connected to the upper top surface and the lower bottom surface. An angle between the side surface and the upper top surface is less than or equal to 90 degrees, and/or an angle between the side surface and the lower bottom surface is greater than or equal to 90 degrees. Due to this shape and design of the support pillar 133, after the deposition of the material of the common electrode layer 135, a portion of the common electrode layer 135 which covers the upper top surface of the support pillar 133 cannot form a continuous film layer with a portion of the common electrode layer 135 which covers the pixel definition layer 132 and the light-emitting material layer 134, so that the portion of the common electrode layer 135 covering the upper top surface of the support pillar 133 forms a floating electrode 1351, and the portion of the common electrode layer 135 covering the pixel definition layer 132 and the light-emitting material layer 134 form a common electrode 1352, and the floating electrode 1351 is disconnected from the common electrode 1352, as shown in FIGS. 1 to 9.

The encapsulation layer 140 is formed on the common electrode layer 135 and is used to encapsulate the OLED display panel to prevent water and oxygen from entering the light-emitting function layer 130. The encapsulation layer 140 generally comprises a first inorganic layer, a second inorganic layer, and an organic layer disposed between the first inorganic layer and the second inorganic layer.

The touch layer 150 is formed on the encapsulation layer 140, and comprises a second buffer layer 152, a touch electrode 151, an insulating layer 153, and a passivation layer 154 disposed in a direction away from the encapsulation layer 140.

Figure 10:
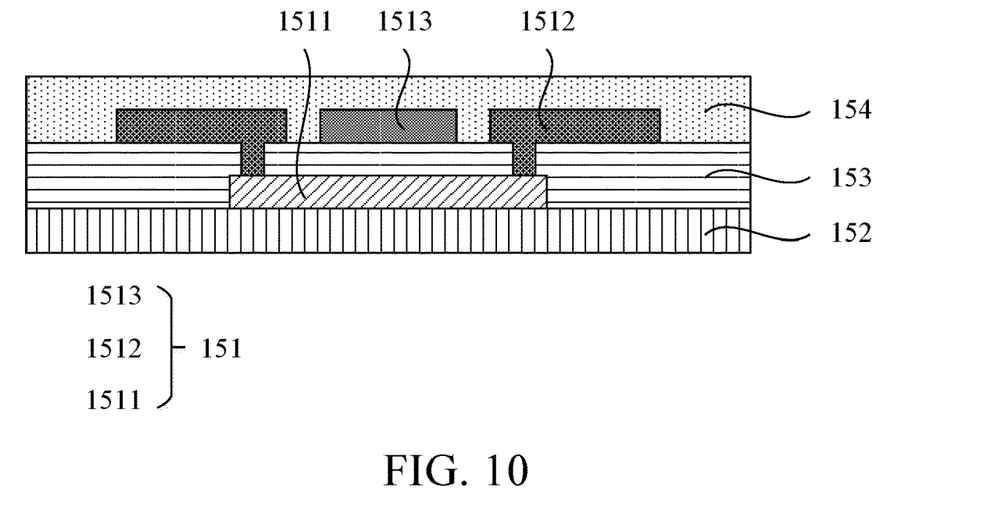
FIG. 10 is a schematic structural view illustrating a touch layer according to one embodiment of the present application.

Please refer to FIG. 10 for details. FIG. 10 is a schematic structural view illustrating a touch layer according to one embodiment of the present application. As shown in FIG. 10, the touch layer 150 comprises: a second buffer layer 152; bridge electrodes 1511 disposed on the second buffer layer 152; an insulating layer 153 covering the bridge electrodes 1511; first touch electrodes 1512 and second touch electrodes 1513 disposed on the insulating layer 153, wherein the adjacent first touch electrodes 1512 are connected to the same bridge electrode 1511 through via holes; and a passivation layer 154 covering the first touch electrodes 1512 and the second touch electrodes 1513. The first touch electrode 1512 is a touch driving electrode, and the second touch electrode 1513 is a touch sensing electrode; or alternatively, the first touch electrode 1512 is a touch sensing electrode, and the second touch electrode 1513 is a touch driving electrode.

Figure 11:
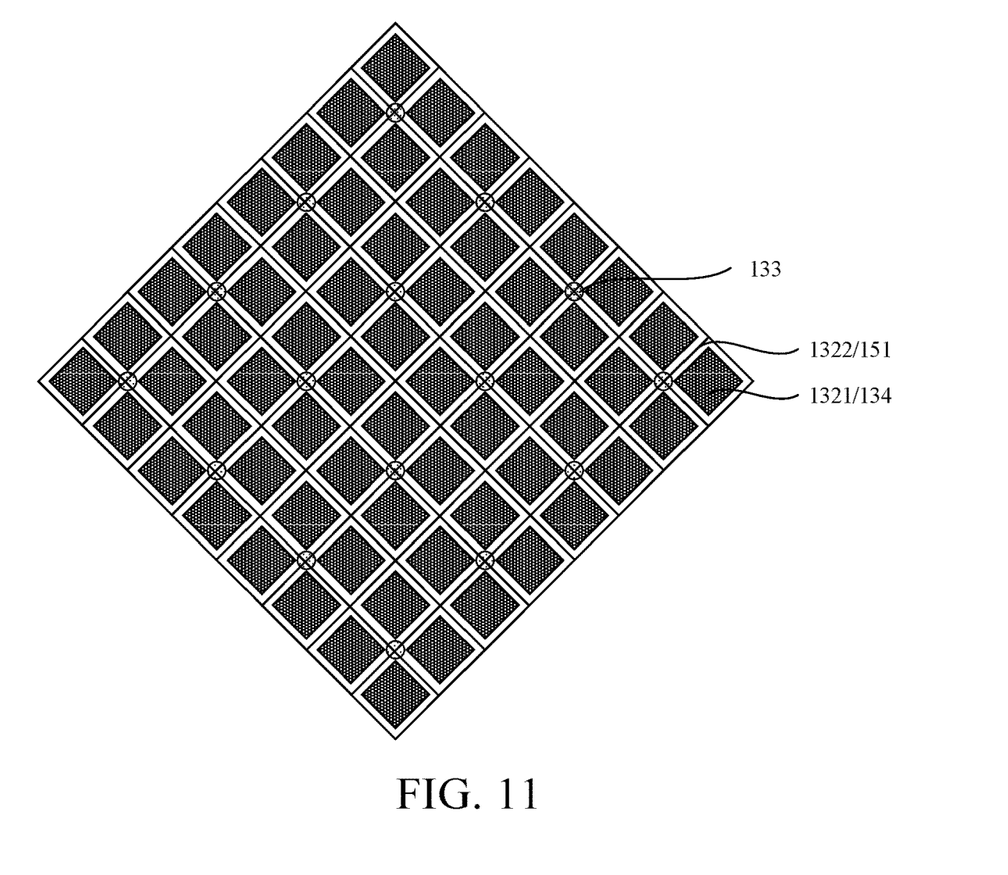
FIG. 11 is a schematic plan view illustrating a touch electrode according to one embodiment of the present application.

Please refer to FIG. 11 for details. FIG. 11 is a schematic plan view illustrating a touch electrode according to one embodiment of the present application. As shown in FIG. 11, the touch electrode 151 has a grid structure. The touch electrode 151 surrounds sub-pixels, areas enclosed by grid lines of the touch electrode 151 are in positions corresponding to the light-emitting material layer 134, that is, the grid lines of the touch electrode 151 are located between the adjacent pixel definition regions 1321 and surround the pixel definition regions 1321. The support pillars 133 are also arranged between the adjacent pixel definition regions 1321, and a projection of the touch electrode 151 projected on the base substrate 110 at least partially overlaps a projection of the support pillars 133 projected on the base substrate 110. Furthermore, a projection of the grid lines of the touch electrode 151 projected on the base substrate 110 passes through the projection of the support pillars 133 projected on the base substrate 110.

In conventional techniques, a common electrode is formed on an entire surface, so a higher parasitic capacitance is formed between the common electrode covering the support pillar and the touch electrode. However, in the OLED display panel of the present embodiment, the floating electrode 1351 is disconnected from the common electrode 1352, thus greatly reducing the parasitic capacitance between the touch electrode and the common electrode, and thereby improving the report rate for touch control and touch sensitivity of the OLED display panel.

The support pillar 133 provides a supporting function in the OLED display panel. Therefore, a geometric shape of the support pillar 133 is generally a pillar with a good supporting effect, which can be a prismatoid. The prismatoid means a polyhedron with all vertices in the two parallel planes, the side faces of the prismatoid can be triangular, trapezoidal, or parallelogram. In the embodiment provided in the present application, the two parallel planes of the prismatoid refer to the upper top surface and the lower bottom surface of the support pillar 133.

Figure 4:
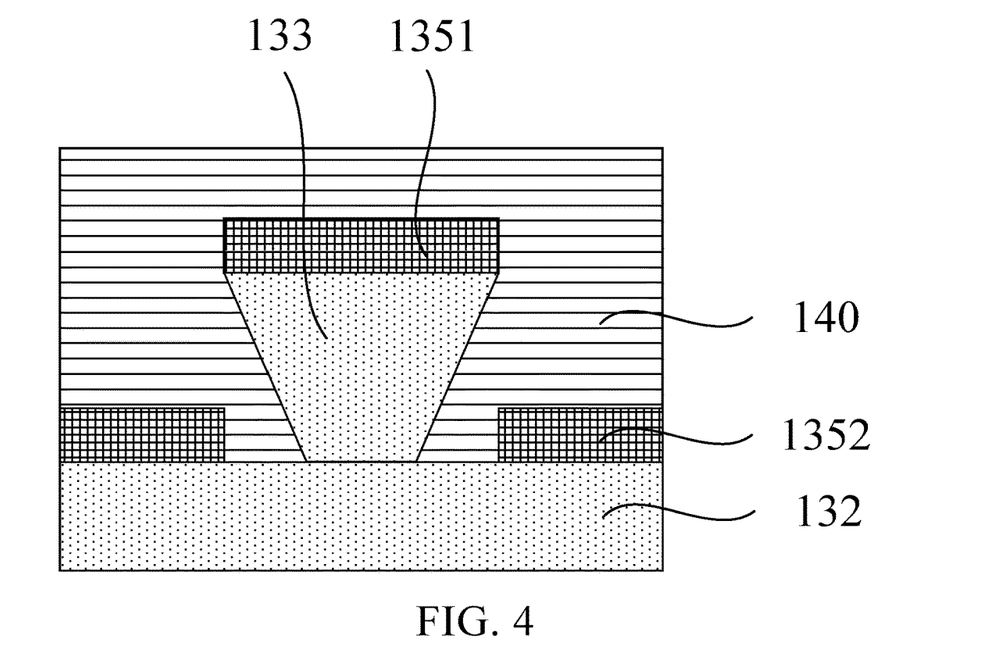
FIG. 4 is a first enlarged schematic view illustrating an area 101 in FIG. 1.

In a first embodiment, the geometric shape of the support pillar 133 is a round platform (i.e., a truncated cone). That is, the upper bottom surface and the lower bottom surface of the support pillar 133 are both circular, the side surface of the support pillar 133 can be unfolded into an annulus sector, and a projection of the lower bottom surface projected on the base substrate 110 falls within a projection of the upper top surface projected on the base substrate 110. Please refer to FIG. 4. FIG. 4 is a first enlarged view illustrating an area 101 in FIG. 1, that is, a first cross-sectional structural view of the support pillar 133. A cross section of the support pillar 133 gradually decreases in size in a direction away from the upper top surface, and there is no smooth transition between the support pillar 133 and the pixel definition layer 132. After deposition of the material of the common electrode layer 135, the portion of the common electrode layer 135 covering the upper top surface of the support pillar 133 cannot form a continuous film with the portion of the common electrode layer 135 covering the pixel definition layer 132 and the light-emitting material layer 134. As a result, the portion of the common electrode layer 135 covering the upper top surface of the support pillar 133 forms a floating electrode 1351, the portion of the common electrode layer 135 covering the pixel definition layer 132 and the light-emitting material layer 134 forms a common electrode 1352. The floating electrode 1351 is disconnected from the common electrode 1352. The floating electrode 1351 does not receive electrical signals, thus reducing the parasitic capacitance between the touch electrode 151 and the common electrode 1352, thereby improving the report rate for touch control on the OLED display panel and touch sensitivity.

In a second embodiment, the geometric shape of the support pillar 133 is an elliptical platform. That is, the upper top surface and the lower bottom surface of the support pillar 133 are both oval, the side surface of the support pillar 133 can be unfolded into an irregular annulus sector, and the projection of the upper top surface projected on the base substrate 110 falls into the projection of the lower bottom surface projected on the base substrate 110. The cross-sectional structure of the support pillar 133 is shown in FIG. 4. For details, please refer to the first embodiment, and a detailed description thereof is not repeated here.

In a third embodiment, the geometric shape of the support pillar 133 is a prism. That is, the upper top surface and the lower bottom surface of the support pillar 133 are all polygons with the same shape, and the polygon can be any of triangles, quadrilaterals, pentagons, hexagons, and etc. and can be regular polygons or not. The side surface of the support pillar 133 is trapezoidal, and the projection of the upper top surface projected on the base substrate 110 falls within the projection of the lower bottom surface projected on the base substrate 110. The cross-sectional structure of the support pillar 133 is also shown in FIG. 4. For details, please refer to the first embodiment, and a detailed description is not repeated here.

Figure 5:
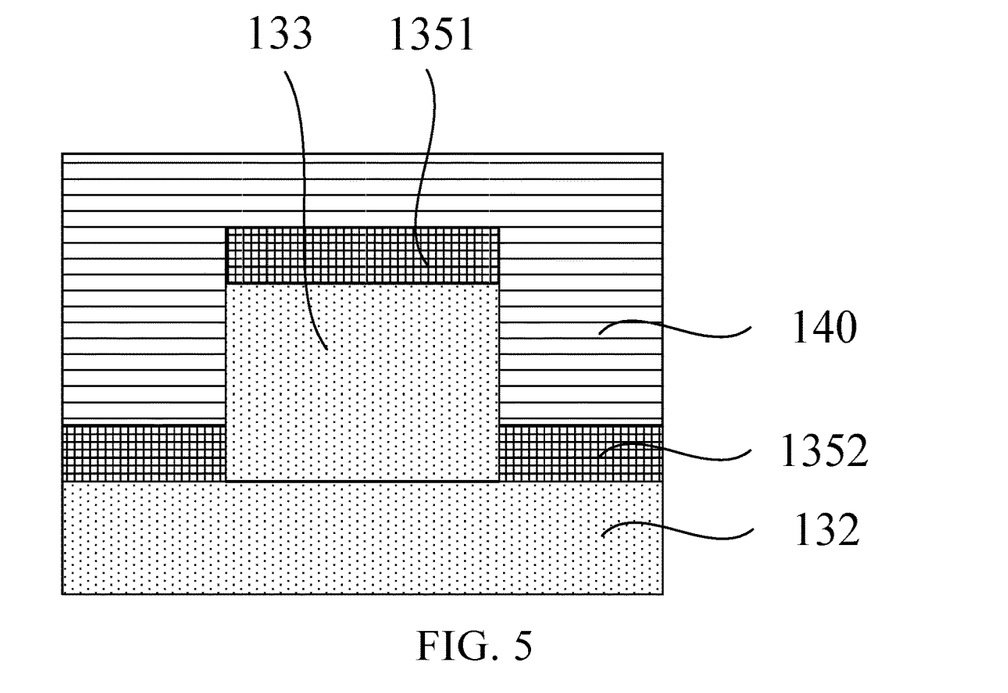
FIG. 5 is a second enlarged schematic view illustrating the area 101 in FIG. 1.

In a fourth embodiment, the geometric shape of the support pillar 133 is a cylinder. That is, the upper top surface and the lower bottom surface of the support pillar 133 are both circular, the side surface of the support pillar 133 can be unfolded into a rectangle, and the projection of the upper top surface projected on the base substrate 110 coincides the projection of the lower bottom surface projected on the base substrate 110. Please refer to FIG. 5. FIG. 5 is a second enlarged view of the area 101 in FIG. 1, that is, a second cross-sectional view of the support pillar 133. The side surface of the support pillar 133 is perpendicular to an upper surface of the pixel definition layer 132, there is no smooth transition between the support pillar 133 and the pixel definition layer 132, and a height of the support pillar 133 with respect to the pixel definition layer 132 ranges from 1.5 to 2 microns (micrometers), which is much greater than a thickness of 15 to 20 nanometers of the common electrode layer 135.

After deposition of the material of the common electrode layer 135, the portion of the common electrode layer 135 covering the upper top surface of the support pillar 133 cannot form a continuous film with the portion of the common electrode layer 135 covering the pixel definition layer 132 and the light-emitting material layer 134. As a result, the portion of the common electrode layer 135 covering the upper top surface of the support pillar 133 forms a floating electrode 1351, and the portion of the common electrode layer 135 covering the pixel definition layer 132 and the light-emitting material layer 134 forms a common electrode 1352, and the floating electrode 1351 is disconnected from the common electrode 1352. The floating electrode 1351 does not receive electrical signals, thus reducing the parasitic capacitance between the touch electrode 151 and the common electrode 1352, thereby improving a report rate for touch control on the OLED display panel and touch sensitivity.

In a fifth embodiment, the geometric shape of the support pillar 133 is a prism. That is, the upper top surface and the lower bottom surface of the support pillar 133 are all polygons with the same shape, and the polygon can be any of triangles, quadrilaterals, pentagons, hexagons, and etc. and can be regular polygons or not. The side surface of the support pillar 133 is rectangular, and the projection of the upper top surface projected on the base substrate 110 coincides with the projection of the lower bottom surface projected on the base substrate 110. The cross-sectional structure of the support pillar 133 is shown in FIG. 5. For details, please refer to the fourth embodiment, and a detailed description is not repeated here.

In a sixth embodiment, the geometric shape of the support pillar 133 is a tower. That is, the upper top surface of the support pillar 133 is a polygon, and the lower bottom surface of the support pillar 133 is a polygon with twice the number of sides of the upper top surface; or alternatively, the lower bottom surface of the support pillar 133 is a polygon, and the upper top surface of the support pillar 133 is a polygon with twice the number of sides of the lower bottom surface. Lateral sides of the support pillar 133 are rectangular or triangular. The projection of the upper top surface projected on the base substrate 110 falls within the projection of the lower bottom surface projected on the base substrate 110. The cross-sectional structure of the support pillar 133 is shown in FIG. 4 or FIG. 5. For details, please refer to the first or fourth embodiment, and a detailed description thereof is not repeated here.

Figure 6:
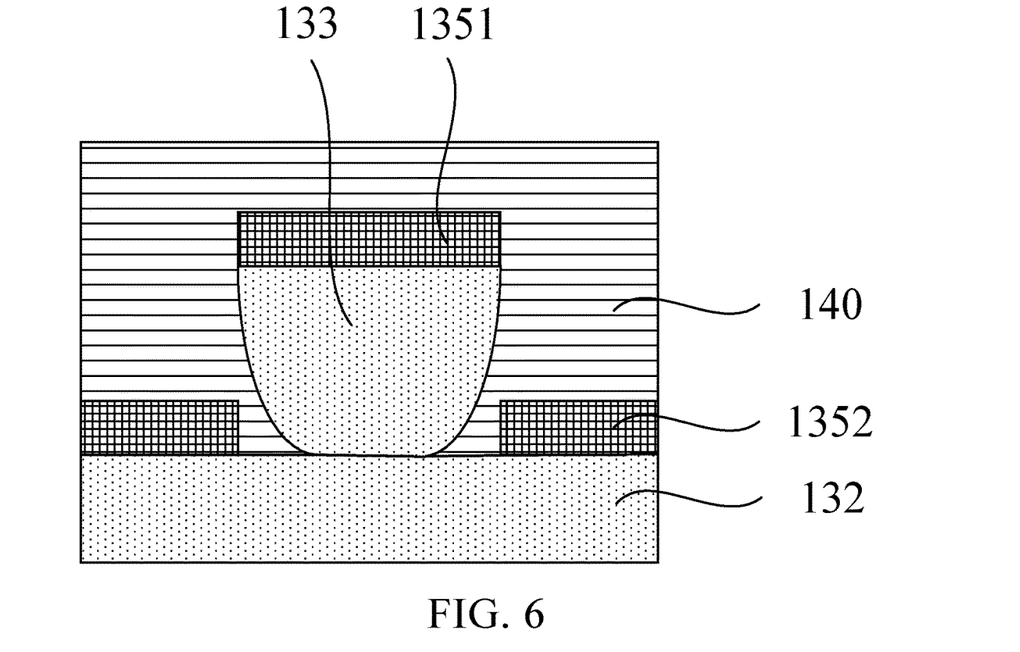
FIG. 6 is a third enlarged schematic view illustrating the area 101 in FIG. 1.

In a seventh embodiment, the geometric shape of the support pillar 133 is a ball-like platform. That is, the upper top surface and the lower bottom surface of the support pillar 133 are both circular, the side surface of the support pillar 133 is a spherical surface, and the projection of the lower bottom surface projected on the base substrate 110 falls within the projection of the upper top surface projected on the base substrate 110. Please refer to FIG. 6. FIG. 6 is a third enlarged view of the area 101 in FIG. 1, that is, a third cross-sectional structural view of the support pillar 133. The cross section of the support pillar 133 gradually decreases in size in a direction away from the upper top surface, and there is no smooth transition between the support pillar 133 and the pixel definition layer 132. After deposition of the material of the common electrode layer 135, the portion of the common electrode layer 135 covering the upper top surface of the support pillar 133 cannot form a continuous film with the portion of the common electrode layer 135 covering the pixel definition layer 132 and the light-emitting material layer 134. As a result, the portion of the common electrode layer 135 covering the upper top surface of the support pillar 133 forms a floating electrode 1351, the portion of the common electrode layer 135 covering the pixel definition layer 132 and the light-emitting material layer 134 forms a common electrode 1352, and the floating electrode 1351 is disconnected from the common electrode 1352. The floating electrode 1351 does not receive electrical signals, thus reducing the parasitic capacitance between the touch electrode 151 and the common electrode 1352, thereby improving the report rate for touch control on the OLED display panel and enhancing touch sensitivity.

Figure 7:
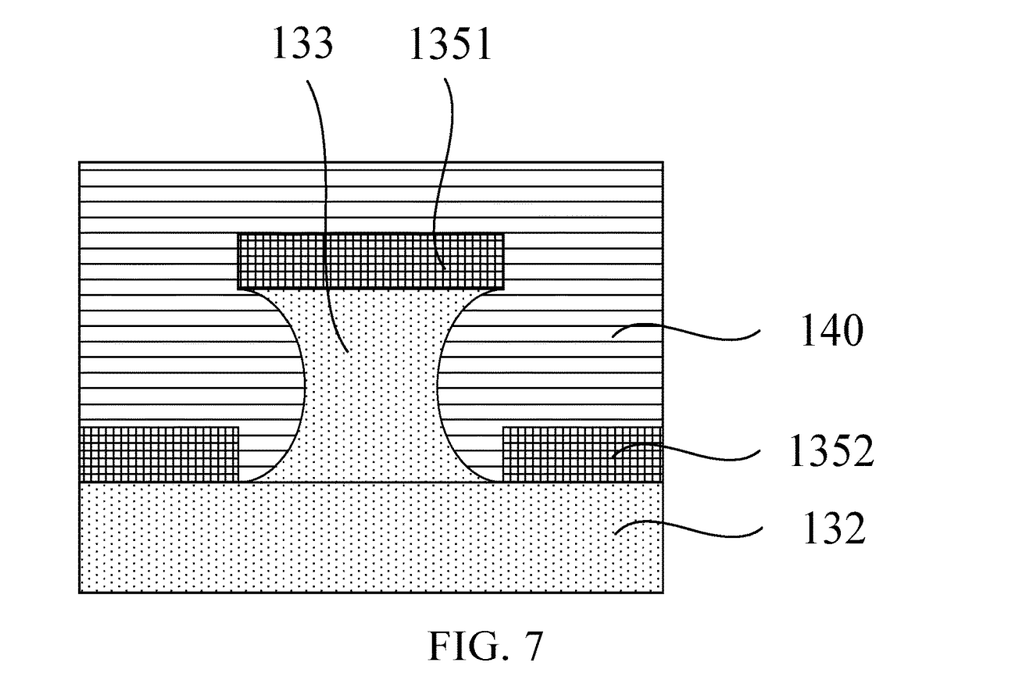
FIG. 7 is a fourth enlarged schematic view illustrating the area 101 in FIG. 1.

In an eighth embodiment, the shape of the support pillar 133 can also be a prismatoid comprising at least one side surface, the angle between the side surface and the upper top surface is less than or equal to 90 degrees, and/or the angle between the side surface and the lower bottom surface is greater than or equal to 90 degrees. Please refer to FIG. 7. FIG. 7 is a fourth enlarged view of the area 101 in FIG. 1, that is, a fourth cross-sectional structural view of the support pillar 133. The side surface of the support pillar 133 is a concave curved surface, and the cross section of the support pillar 133 decreases and then increases in size in the direction away from the upper top surface. There is no smooth transition between the support pillar 133 and the pixel definition layer 132. After deposition of the material of the common electrode layer 135, the portion of the common electrode layer 135 covering the upper top surface of the support pillar 133 cannot form a continuous film with the portion of the common electrode layer 135 covering the pixel definition layer 132 and the light-emitting material layer 134. As a result, the portion of the common electrode layer 135 covering the upper top surface of the support pillar 133 forms a floating electrode 1351, the portion of the common electrode layer 135 covering the pixel definition layer 132 and the light-emitting material layer 134 forms a common electrode 1352, and the floating electrode 1351 is disconnected from the common electrode 1352. The floating electrode 1351 does not receive electrical signals, thus reducing the parasitic capacitance between the touch electrode 151 and the common electrode 1352, thereby improving the report rate for touch control on the OLED display panel and enhancing touch sensitivity.

The geometric shape of the support pillar 133 can also be a non-prismatoid shape.

Figure 8:
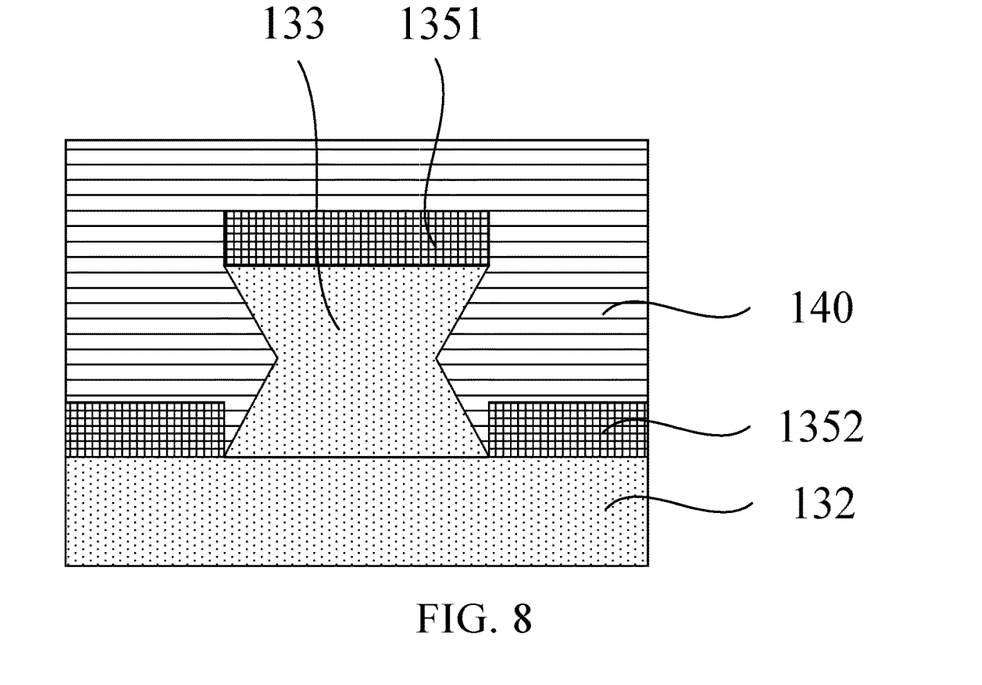
FIG. 8 is a fifth enlarged schematic view illustrating the area 101 in FIG. 1.

In a ninth embodiment, the support pillar 133 has at least one vertex which is located on the side surface and outside the upper top surface and the lower bottom surface of the support pillar 133. A projection of the vertex projected on the base substrate is located within the projection of the upper top surface of the support pillar 133 projected on the base substrate. Please refer to FIG. 8. FIG. 8 is a fifth enlarged view of the area 101 in FIG. 1, that is, a fifth cross-sectional structural view illustrating the support pillar 133. The side surface of the support pillar 133 is a concave folded surface, and the size of the cross section of the support pillar 133 decreases first and then increases in the direction away from the upper top surface. There is no smooth transition between the support pillar 133 and the pixel definition layer 132. The upper top surface and the lower bottom surface of the support pillar 133 can be any geometrical shape, and the structural design is within the protection scope of the present embodiment, as long as it meets the requirement that the portion of the common electrode layer 135 covering the upper top surface of the support pillar 133 is disconnected from the portion of the common electrode layer 135 covering the pixel definition layer 132.

Figure 9:
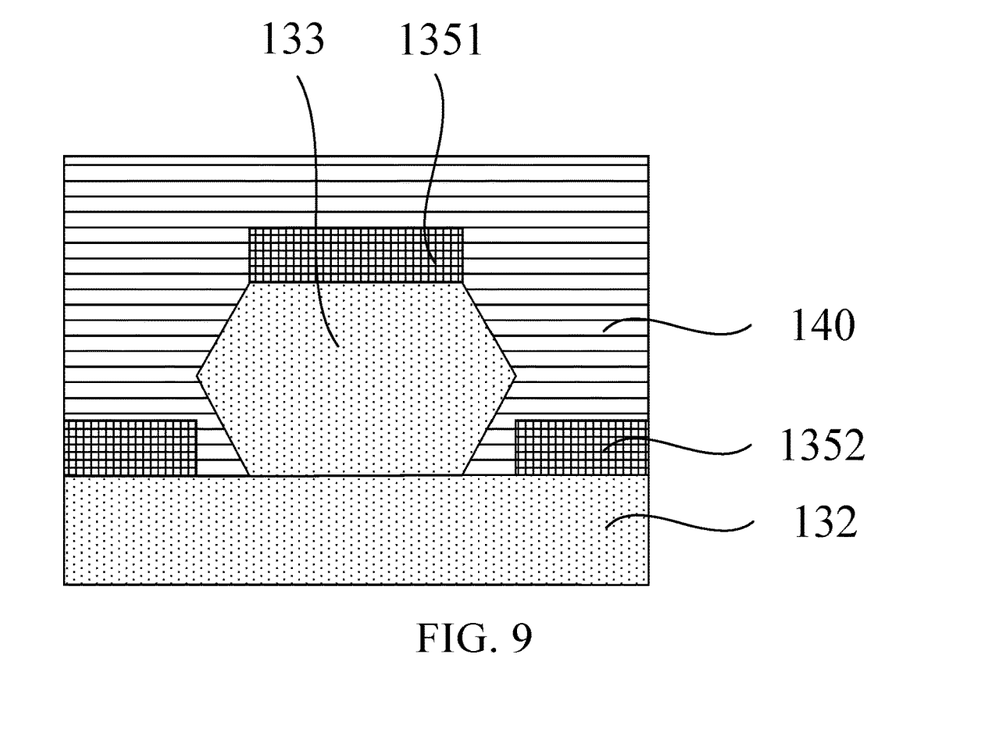
FIG. 9 is a sixth enlarged schematic view illustrating the area 101 in FIG. 1.

In a tenth embodiment, the support pillar 133 has at least one vertex which is located on the side surface and outside the upper top surface and the lower bottom surface of the support pillar 133. The projection of the vertex projected on the base substrate is located outside the projection of the upper top surface of the support pillar 133 projected on the base substrate. Please refer to FIG. 9. FIG. 9 is a sixth enlarged view of the area 101 in FIG. 1, that is, a sixth cross-sectional structural view of the support pillar 133. The side surface of the support pillar 133 is a convex folded surface, and the size of the cross section of the support pillar 133 first increases and then decreases in the direction away from the upper top surface. There is no smooth transition between the support pillar 133 and the pixel definition layer 132. The upper top surface and the lower bottom surface of the support pillar 133 can be any geometrical shape, and the structural design is within the protection scope of the present embodiment as long as it meets the requirement that the portion of the common electrode layer 135 covering the upper top surface of the support pillar 133 is disconnected from the portion of the common electrode layer covering the pixel definition layer.

The vertex refers to an intersection of two or more edges, hyperedges, lines, line segments or curves and other mathematical objects. A corner or end point of a polyhedron or polygon intersected by two sides or edges is called a vertex.

In the aforementioned geometrical shape of the support pillar 133, the vertex is an intersection of the side surfaces of the support pillar 133.

Figure 2:
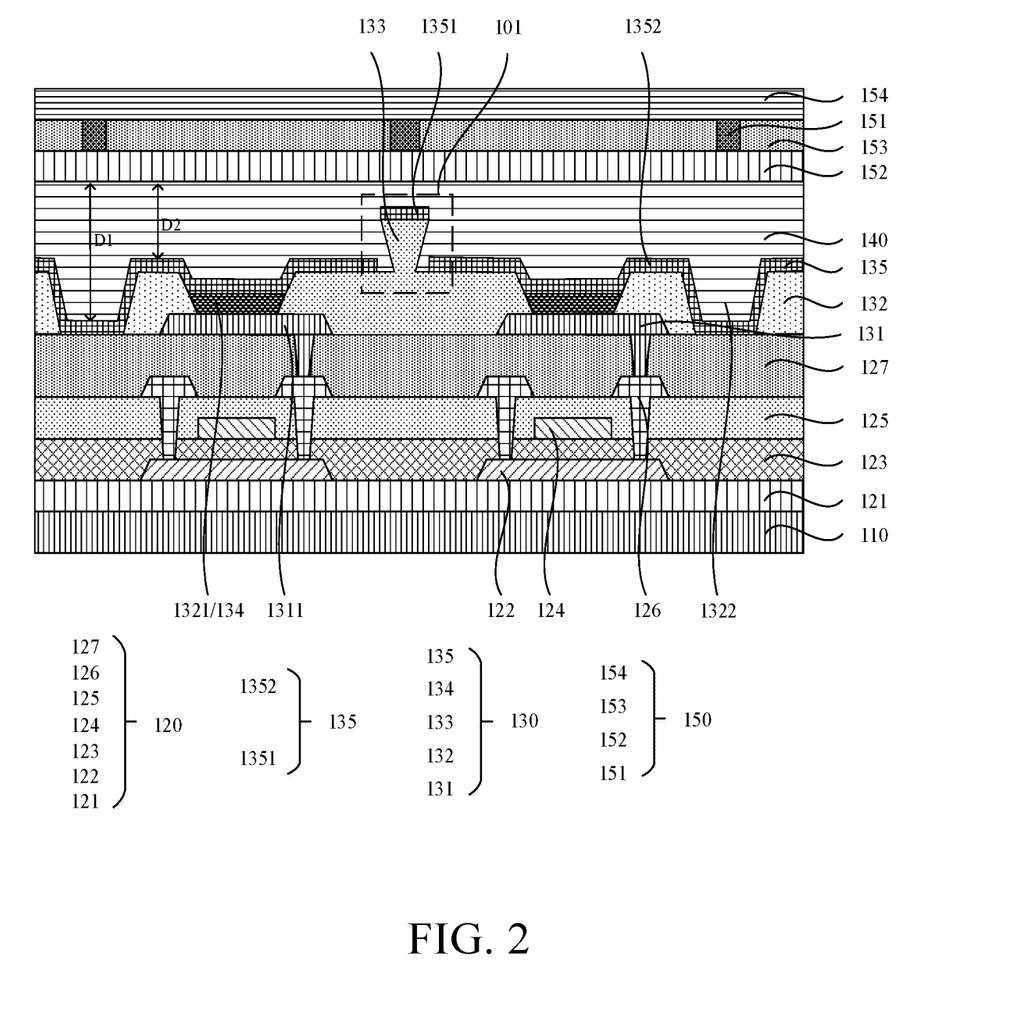
FIG. 2 is a second structural view illustrating the OLED display panel according to one embodiment of the application.
Figure 3:
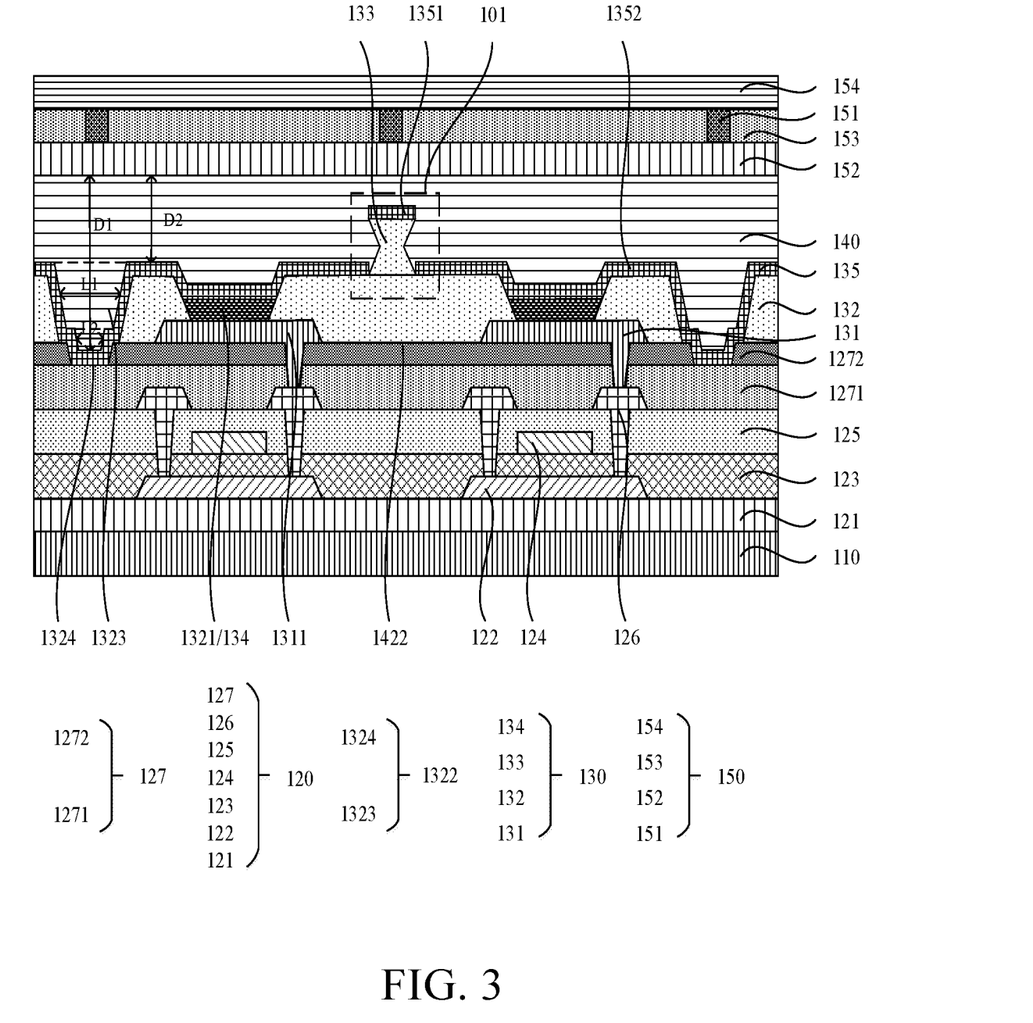
FIG. 3 is a third structural view illustrating the OLED display panel according to one embodiment of the application.

In addition, please refer to FIGS. 2 and 3. FIGS. 2 and 3 respectively show the second and third structural views of the OLED display panel of the present application. In the OLED display panel of the present application, the pixel definition layer 132 can also be patterned to form a groove 1322, and the groove 1322 is disposed between at least two adjacent pixel definition regions 1321. A projection of the touch electrode 151 projected on the base substrate 110 and a projection of the groove 1322 projected on the substrate 110 at least partially overlap. Further, the projection of the touch electrode 151 projected on the base substrate 110 falls within the projection of the groove 1322 projected on the base substrate 110.

At the groove 1322, the common electrode 1352 is formed on sides and a bottom of the groove 1322, and the touch electrode 151 is formed right above the groove 1322. Therefore, a distance D1 between the touch electrode 151 and the common electrode 1352 located right under the touch electrode 151 is greater than a distance D2 between the touch electrode 151 and the common electrode 1352 right under the touch electrode 151 under a circumstance where no grooves 1322 are defined. This way, the distance between the touch electrode 151 and the common electrode 135 is increased, so the parasitic capacitance between the common electrode 135 and the touch electrode 151 is reduced, thus improving the report rate for touch control on the OLED display panel and enhancing touch sensitivity.

The groove 1322 can have a different depth, so the distance between the touch electrode 151 and the common electrode 135 can be different, the parasitic capacitance between the touch electrode 151 and the common electrode 135 can also be different, and the report rate for touch control and touch sensitivity of the OLED display panel can be different.

In a first embodiment solution, the groove 1322 is defined in the pixel definition layer 132, and the bottom of the groove 1322 is located in the pixel definition layer 132. Compared with conventional techniques, the present embodiment solution increases the distance between the touch electrode 151 and the common electrode 135, and an increased distance is from the bottom of the groove 1322 to an upper surface of the pixel definition layer 132, thus reducing the parasitic capacitance between the common electrode 135 and the touch electrode 151, and improving the report rate for touch control and enhancing touch sensitivity of the OLED display panel.

In a second embodiment solution, as shown in FIG. 2, the groove 1322 penetrates the pixel definition layer 132, and the bottom of the groove 1322 is located at an interface between the pixel definition layer 132 and the planarization layer 127. Compared with the first embodiment solution, the present embodiment solution further increases the distance between the touch electrode 151 and the common electrode 135, and an increased distance is the thickness of the pixel definition layer 132, thus further reducing the parasitic capacitance between the common electrode 135 and the touch electrode 151, improving the report rate for touch control, and enhancing touch sensitivity of the OLED display panel.

In a third embodiment solution, the groove 1322 penetrates the pixel definition layer 132, and the bottom of the groove 1322 is located in the planarization layer 127. Compared with the second embodiment solution, the present embodiment solution further increases the distance between the touch electrode 151 and the common electrode 135, and an increased distance is from the bottom of the groove 1322 to the upper surface of the pixel definition layer 132, thus further reducing the parasitic capacitance between the common electrode 135 and the touch electrode 151, and improving the report rate for touch control and touch sensitivity of the OLED display panel. In a fourth embodiment solution, the groove 1322 penetrates both the pixel definition layer 132 and the planarization layer 127, and the bottom of the groove 1322 is located at an interface between the planarization layer 127 and the second insulating layer 127. Compared with the third embodiment solution, the present embodiment solution further increases the distance between the touch electrode 151 and the common electrode 135, and an increased distance is the total thickness of the pixel definition layer 132 and the planarization layer 127, thus further reducing the parasitic capacitance between the common electrode 135 and the touch electrode 151, improving the report rate for touch control, and enhancing touch sensitivity of the OLED display panel.

In a fifth embodiment solution, as shown in FIG. 3, the groove 1322 comprises a first groove portion 1323 and a second groove portion 1324, and the second groove portion 1324 is arranged at one side of the first groove portion 1323 away from the encapsulation layer 140. A projection of the second groove portion 1324 projected on the base substrate 110 falls within a projection of the first groove portion 1323 projected on the base substrate 110, and has a smaller area than the projection of the first groove portion 1323 projected on the base substrate 110, that is, a widthwise opening L1 of the first groove portion 1323 is larger than a widthwise opening L2 of the second groove portion 1324.

In the case where the groove 1322 has a certain depth, and the side of the groove 1322 is inclined at a certain angle, the configuration of the first groove portion 1323 and the second groove portion 1324 provides a transition step for deposition of the common electrode 135 on the side of the groove 1322, which prevents the common electrode 135 from being disconnected at the groove 1322 due to an overly-great depth of the groove 1322 or an excessively large inclination angle of the side of the groove 1322.

The first groove portion 1323 and the second groove portion 1324 are both located inside the pixel definition layer 132, and the bottom of the second groove portion 1324 is located within the pixel definition layer 132. Compared with the first embodiment solution, the present embodiment solution also increases the distance between the touch electrode 151 and the common electrode 135, and an increased distance is from the bottom of the second groove 1324 to the upper surface of the pixel definition layer 132, thus reducing the parasitic capacitance between the common electrode 135 and the touch electrode 151, improving the report rate for touch control, enhancing touch sensitivity of the OLED display panel, and at the same time, preventing the common electrode 135 from being disconnected at the groove 1322 due to an overly-great depth of the groove 1322 or an excessively large inclination angle of the side of the groove 1322.

In a sixth embodiment solution, the first groove portion 1323 and the second groove portion 1324 are both located in the pixel definition layer 132, and the bottom of the second groove portion 1324 is located at an interface between the pixel definition layer 132 and the planarization layer 127. Compared with the fifth embodiment solution, the present embodiment solution further increases the distance between the touch electrode 151 and the common electrode 135, and an increased distance is the thickness of the pixel definition layer 132, thus further reducing the parasitic capacitance between the common electrode 135 and the touch electrode 151, improving the report rate for touch control, and enhancing touch sensitivity of the OLED display panel.

In a seventh embodiment solution, the first groove 1323 penetrates the pixel definition layer 132, the second groove portion 1324 is located in the planarization layer 127, and the bottom of the second groove portion 1324 is located inside the planarization layer 127. Compared with the sixth embodiment solution, the present embodiment solution further increases the distance between the touch electrode 151 and the common electrode 135, and an increased distance is from the bottom of the second groove portion 1324 to the upper surface of the pixel definition layer 132, thus further reducing the parasitic capacitance between the common electrode 135 and the touch electrode 151, improving the report rate for touch control, and enhancing touch sensitivity of the OLED display panel.

In an eighth embodiment solution, the first groove portion 1323 penetrates the pixel definition layer 132, the second groove portion 1324 penetrates the planarization layer 127, and the bottom of the second groove portion 1324 is located at the interface between the planarization layer 127 and the second insulating layer 125. Compared with the seventh embodiment solution, the present embodiment solution further increases the distance between the touch electrode 151 and the common electrode 135, and an increased distance is a total thickness of the pixel definition layer 132 and the planarization layer 127, thus further reducing the parasitic capacitance between the common electrode 135 and the touch electrode 151, improving the report rate for touch control, and enhancing touch sensitivity of the OLED display panel.

In a ninth embodiment solution, the planarization layer 127 comprises a first planarization layer 1271 and a second planarization layer 1272, and the first planarization layer 1271 is disposed at one side of the second planarization layer 1272 away from the encapsulation layer 140, the first groove portion 1323 penetrates the pixel definition layer 132, the second groove portion 1324 penetrates the first planarization layer 1271, and the bottom of the second groove portion 1324 is located at an interface between the first planarization layer 1271 and the second planarization layer 1272.

The planarization layer 127 covers the source/drain layer 126, and the metal lines on the source/drain layer 126 are dense, and therefore, when the bottom of the groove 1322 is located at the interface between the planarization layer 127 and the second insulating layer 125, there is a risk that the common electrode 135 is short-circuited with the metal lines on the source/drain layer 126. Compared with the eighth embodiment solution, the present embodiment solution has the bottom of the second groove portion 1324 located on the interface between the first planarization layer 1271 and the second planarization layer 1272, and the common electrode 135 is deposited on an upper surface of the second planarization layer 1272, thereby avoiding the risk of the common electrode 135 being short-circuited with the metal lines on the source/drain layer 126.

The present application further provides an electronic device comprising an organic light-emitting diode (OLED) display panel, the OLED display panel comprising:
  a base substrate;
  a driving circuit layer arranged on the base substrate;
  a light-emitting function layer arranged on the driving circuit layer, the light-emitting function layer comprising a pixel electrode layer, a pixel definition layer, a support pillar, a light-emitting material layer, and a common electrode layer which are sequentially arranged in a direction away from the base substrate, the common electrode layer covering the pixel definition layer, the support pillar, and the light-emitting material layer;
  an encapsulation layer arranged on the common electrode layer; and
  a touch layer arranged on the encapsulation layer and comprising a touch electrode, wherein the touch electrode is a grid structure surrounding the light-emitting material layer, and a projection of the touch electrode projected on the base substrate at least partially overlaps a projection of the support pillar projected on the base substrate;
  wherein the support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
  wherein the common electrode layer comprises a floating electrode covering the upper top surface and a common electrode covering the pixel definition layer and the light-emitting material layer, and the floating electrode is disconnected from the common electrode.

This embodiment provides an electronic device, the electronic device comprises the OLED display panel of the present application. The OLED display panel has an improved structural design for the support pillar, so that there is no smooth transition between the support pillar and the pixel definition layer. After deposition of the material of the common electrode layer, the portion of the common electrode layer covering the upper top surface of the support pillar cannot form a continuous film layer with the portion of the common electrode layer covering the pixel definition layer and the light-emitting material layer. Therefore, the portion of the common electrode layer covering the upper top surface of the support pillar forms a floating electrode, the portion of the common electrode layer covering the pixel definition layer and the light-emitting material layer forms a common electrode, and the floating electrode is disconnected from the common electrode. The floating electrode does not receive electrical signals, thus reducing the parasitic capacitance between the touch electrode and the common electrode, thereby improving the report rate for touch control, and enhancing touch sensitivity of the OLED display panel.

According to one embodiment, a projection of grid lines of the touch electrode projected on the base substrate passes through a projection of the support pillar projected on the base substrate.

According to one embodiment, a height of the support pillar with respect to the pixel definition layer ranges from 1.5 microns to 2 microns, and a thickness of the common electrode layer ranges from 15 nanometers to 20 nanometers.

According to one embodiment, a geometric shape of the support pillar is a prismatoid.

According to one embodiment, a geometric shape of the support pillar is any one of a round platform, a prism, a ball-like platform, and a tower, and a projection of the lower bottom surface of the support pillar projected on the substrate is located within a projection of the upper top surface of the support pillar projected on the base substrate.

According to one embodiment, the geometric shape of the support pillar is a prism, a lower bottom surface of the prism is in contact with the pixel definition layer, and a projection of the lower bottom surface of the prism projected on the base substrate is located within a projection of the an upper top surface of the prism projected on the base substrate.

According to one embodiment, a geometric shape of the support pillar is a ball-like platform, a lower bottom surface of the ball-like platform is in contact with the pixel definition layer, and the lower bottom surface of the ball-like platform projected on the base substrate is located within a projection of an upper top surface of the ball-like platform projected on the base substrate.

According to one embodiment, the geometric shape of the support pillar is a tower, a lower bottom surface of the tower is in contact with the pixel definition layer, and a projection of the lower bottom surface of the tower projected on the base substrate is located within a projection of an upper top surface of the tower projected on the base substrate.

According to one embodiment, the geometric shape of the support pillar is a cylinder.

According to one embodiment, the geometric shape of the support pillar is a prism.

According to one embodiment, at least one side surface of the support pillar is a concave curved surface, and an angle between the curved surface and the upper top surface of the support pillar and an angle between the curved surface and the lower bottom surface of the support pillar are both acute.

According to one embodiment, the geometric shape of the support pillar is a non-prismatoid.

In summary, the present application provides an organic light-emitting diode (OLED) display panel and an electronic device. The OLED display panel comprises:
a base substrate;
a driving circuit layer arranged on the base substrate;
a light-emitting function layer arranged on the driving circuit layer, the light-emitting function layer comprising a pixel electrode layer, a pixel definition layer, a support pillar, a light-emitting material layer, and a common electrode layer which are sequentially arranged in a direction away from the base substrate, the common electrode layer covering the pixel definition layer, the support pillar, and the light-emitting material layer;
an encapsulation layer arranged on the common electrode layer; and
a touch layer arranged on the encapsulation layer and comprising a touch electrode, wherein the touch electrode is a grid structure surrounding the light-emitting material layer, and a projection of the touch electrode projected on the base substrate at least partially overlaps a projection of the support pillar projected on the base substrate;
wherein the support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
wherein the common electrode layer comprises a floating electrode covering the upper top surface and a common electrode covering the pixel definition layer and the light-emitting material layer, and the floating electrode is disconnected from the common electrode. The OLED display panel has an improved structural design for the support pillar, so that there is no smooth transition between the support pillar and the pixel definition layer. After deposition of the material of the common electrode layer, the portion of the common electrode layer covering the upper top surface of the support pillar cannot form a continuous film layer with the portion of the common electrode layer covering the pixel definition layer and the light-emitting material layer. Therefore, the portion of the common electrode layer covering the upper top surface of the support pillar forms a floating electrode, the portion of the common electrode layer covering the pixel definition layer and the light-emitting material layer forms a common electrode, and the floating electrode is disconnected from the common electrode. The floating electrode does not receive electrical signals, thus reducing the parasitic capacitance between the touch electrode and the common electrode, thereby improving the report rate for touch control, and enhancing touch sensitivity of the OLED display panel.

In summary, although the present application has been disclosed as above in preferable embodiments, the above-mentioned preferable embodiments are not intended to limit the present application. Those of ordinary skill in the art can make various modifications and changes based on the spirit of the present application. Such modifications and changes are deemed to be within the protection scope of the present application, so the protection scope of the present application should be defined by the appended claims.

What is claimed is:

1. An organic light-emitting diode (OLED) display panel, comprising:
a base substrate;
a driving circuit layer arranged on the base substrate;
a light-emitting function layer arranged on the driving circuit layer, the light-emitting function layer comprising a pixel electrode layer, a pixel definition layer, a support pillar, a light-emitting material layer, and a common electrode layer which are sequentially arranged in a direction away from the base substrate, the common electrode layer covering the pixel definition layer, the support pillar, and the light-emitting material layer;
an encapsulation layer arranged on the common electrode layer; and
a touch layer arranged on the encapsulation layer and comprising a touch electrode, wherein the touch electrode is a grid structure surrounding the light-emitting material layer, and a projection of the touch electrode projected on the base substrate at least partially overlaps a projection of the support pillar projected on the base substrate;
wherein the support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
wherein the common electrode layer comprises a floating electrode covering the upper top surface and a common electrode covering the pixel definition layer and the light-emitting material layer, and the floating electrode is disconnected from the common electrode.

2. The OLED display panel according to claim 1, wherein a projection of grid lines of the touch electrode projected on the base substrate passes through a projection of the support pillar projected on the base substrate.

3. The OLED display panel according to claim 1, wherein a height of the support pillar with respect to the pixel definition layer ranges from 1.5 microns to 2 microns, and a thickness of the common electrode layer ranges from 15 nanometers to 20 nanometers.

4. The OLED display panel according to claim 1, wherein a geometric shape of the support pillar is a prismatoid.

5. The OLED display panel according to claim 4, wherein the geometric shape of the support pillar is a round platform, a lower bottom surface of the round platform is in contact with the pixel definition layer, and the lower bottom surface of the round platform projected on the base substrate is located within a projection of an upper top surface of the round platform projected on the base substrate.

6. The OLED display panel according to claim 4, wherein the geometric shape of the support pillar is a prism, a lower bottom surface of the prism is in contact with the pixel definition layer, and a projection of the lower bottom surface of the prism projected on the base substrate is located within a projection of the an upper top surface of the prism projected on the base substrate.

7. The OLED display panel according to claim 4, wherein the geometric shape of the support pillar is a ball-like platform, a lower bottom surface of the ball-like platform is in contact with the pixel definition layer, and the lower bottom surface of the ball-like platform projected on the base substrate is located within a projection of an upper top surface of the ball-like platform projected on the base substrate.

8. The OLED display panel according to claim 4, wherein the geometric shape of the support pillar is a tower, a lower bottom surface of the tower is in contact with the pixel definition layer, and a projection of the lower bottom surface of the tower projected on the base substrate is located within a projection of an upper top surface of the tower projected on the base substrate.

9. The OLED display panel according to claim 4, wherein the geometric shape of the support pillar is a cylinder.

10. The OLED display panel according to claim 4, wherein the geometric shape of the support pillar is a prism.

11. The OLED display panel according to claim 4, wherein at least one side surface of the support pillar is a concave curved surface, and an angle between the curved surface and the upper top surface of the support pillar and an angle between the curved surface and the lower bottom surface of the support pillar are both acute.

12. The OLED display panel according to claim 1, wherein a geometric shape of the support pillar is a non-prismatoid.

13. An electronic device comprising an organic light-emitting diode (OLED) display panel, the OLED display panel comprising:
   a base substrate;
   a driving circuit layer arranged on the base substrate;
   a light-emitting function layer arranged on the driving circuit layer, the light-emitting function layer comprising a pixel electrode layer, a pixel definition layer, a support pillar, a light-emitting material layer, and a common electrode layer which are sequentially arranged in a direction away from the base substrate, the common electrode layer covering the pixel definition layer, the support pillar, and the light-emitting material layer;
   an encapsulation layer arranged on the common electrode layer; and
   a touch layer arranged on the encapsulation layer and comprising a touch electrode, wherein the touch electrode is a grid structure surrounding the light-emitting material layer, and a projection of the touch electrode projected on the base substrate at least partially overlaps a projection of the support pillar projected on the base substrate;
   wherein the support pillar comprises a lower bottom surface in contact with the pixel definition layer, an upper top surface away from the pixel definition layer, and at least one side surface connected to the upper top surface and the lower bottom surface, an angle between the at least one side surface and the upper top surface is less than or equal to 90 degrees, and/or an angle between the at least one side surface and the lower bottom surface is greater than or equal to 90 degrees;
   wherein the common electrode layer comprises a floating electrode covering the upper top surface and a common electrode covering the pixel definition layer and the light-emitting material layer, and the floating electrode is disconnected from the common electrode.

14. The electronic device according to claim 13, wherein a projection of grid lines of the touch electrode projected on the base substrate passes through a projection of the support pillar projected on the base substrate.

15. The electronic device according to claim 13, wherein a height of the support pillar with respect to the pixel definition layer ranges from 1.5 microns to 2 microns, and a thickness of the common electrode layer ranges from 15 nanometers to 20 nanometers.

16. The electronic device according to claim 13, wherein a geometric shape of the support pillar is a prismatoid.

17. The electronic device according to claim 16, wherein the geometric shape of the support pillar is any one of a round platform, a prism, a ball-like platform, and a tower, and a projection of the lower bottom surface of the support pillar projected on the substrate is located within a projection of the upper top surface of the support pillar projected on the base substrate.

18. The electronic device according to claim 16, wherein the geometric shape of the support pillar is a cylinder or a prism.

19. The electronic device according to claim 16, wherein at least one side surface of the support pillar is a concave curved surface, and an angle between the curved surface and the upper top surface of the support pillar and an angle between the curved surface and the lower bottom surface of the support pillar are both acute.

20. The electronic device according to claim 13, wherein a geometric shape of the support pillar is a non-prismatoid.

* * * * *